US012745567B2

(12) United States Patent
Mochizuki et al.

(10) Patent No.: US 12,745,567 B2
(45) Date of Patent: Sep. 22, 2026

(54) PIEZOELECTRIC ELEMENT AND MANUFACTURING METHOD FOR PIEZOELECTRIC ELEMENT

(71) Applicant: FUJIFILM CORPORATION, Tokyo (JP)

(72) Inventors: Fumihiko Mochizuki, Kanagawa (JP); Seigo Nakamura, Kanagawa (JP); Hiroyuki Kobayashi, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 587 days.

(21) Appl. No.: 18/472,170

(22) Filed: Sep. 21, 2023

(65) Prior Publication Data

US 2024/0023453 A1 Jan. 18, 2024

Related U.S. Application Data

(63) Continuation of application No. PCT/JP2022/010720, filed on Mar. 10, 2022.

(30) Foreign Application Priority Data

Mar. 30, 2021 (JP) ................................ 2021-058186

(51) Int. Cl.
*H01L 41/047* (2006.01)
*H10N 30/06* (2023.01)
*H10N 30/87* (2023.01)

(52) U.S. Cl.
CPC ........... *H10N 30/877* (2023.02); *H10N 30/06* (2023.02)

(58) Field of Classification Search
CPC .................................................... H10N 30/877
(Continued)

(56) References Cited

U.S. PATENT DOCUMENTS

2006/0055745 A1 3/2006 Yagi
2013/0249354 A1 9/2013 Watanabe et al.
(Continued)

FOREIGN PATENT DOCUMENTS

CN 102306678 A 1/2012
JP H05-259472 A 10/1993
(Continued)

OTHER PUBLICATIONS

International Search Report issued in International Application No. PCT/JP2022/010720 on May 24, 2022.
(Continued)

*Primary Examiner* — Derek J Rosenau
(74) *Attorney, Agent, or Firm* — SOLARIS Intellectual Property Group, PLLC

(57) ABSTRACT

The piezoelectric element is a piezoelectric element including, on a substrate in the following order, a lower electrode layer, a piezoelectric film containing a perovskite-type oxide as a main component, and an upper electrode layer, in which at least a region of the upper electrode layer closest to a side of the piezoelectric film is composed of an oxide conductive layer containing In, and regarding an interface region between the piezoelectric film and the oxide conductive layer of the upper electrode layer, in an intensity profile of binding energy, which is acquired by an X-ray photoelectron spectroscopy measurement, a peak intensity ratio $\gamma/\alpha$ satisfies $\gamma/\alpha \leq 0.25$, wherein $\alpha$ is a peak intensity of binding energy derived from a $3d_{5/2}$ orbital of In bonded to oxygen, and $\gamma$ is a peak intensity of binding energy derived from a $3d_{5/2}$ orbital of In bonded to an OH group.

7 Claims, 4 Drawing Sheets

(58) Field of Classification Search
USPC .................................................. 310/364–366
See application file for complete search history.

(56) References Cited

U.S. PATENT DOCUMENTS

| | | | | |
|---|---|---|---|---|
| 2013/0300254 | A1 | 11/2013 | Fujii et al. | |
| 2015/0155418 | A1 | 6/2015 | Hamada | |
| 2018/0160248 | A1 * | 6/2018 | Murakami | ............... G10H 3/14 |
| 2023/0135208 | A1 | 5/2023 | Shibata et al. | |

FOREIGN PATENT DOCUMENTS

| | | | |
|---|---|---|---|
| JP | 2006-086223 | A | 3/2006 |
| JP | 2013-197496 | A | 9/2013 |
| JP | 2013-197553 | A | 9/2013 |
| JP | 2020-092228 | A | 6/2020 |
| WO | 2020/116123 | A1 | 6/2020 |

OTHER PUBLICATIONS

Written Opinion of the ISA issued in International Application No. PCT/JP2022/010720 on May 24, 2022.
Extended European Search Report dated Aug. 12, 2024, issued in corresponding EP Patent Application No. 22779938.4.

* cited by examiner $\frac{t}{\sin\theta}$
15
16
18

18
16
15
θ
diamond knife
t

In-OH

INTENSITY 1.0

0.8

0.6

0.4

0.2

0.0

445.3

445.0

444.7

BINDING ENERGY [eV]

PIEZOELECTRIC ELEMENT AND MANUFACTURING METHOD FOR PIEZOELECTRIC ELEMENT

CROSS-REFERENCE TO RELATED APPLICATIONS

This application is a continuation of International Application No. PCT/JP2022/010720, filed on Mar. 10, 2022, which claims priority from Japanese Patent Application No. 2021-058186, filed on Mar. 30, 2021. The entire disclosure of each of the above applications is incorporated herein by reference.

BACKGROUND

1. Technical Field

The present disclosure relates to a piezoelectric element and a manufacturing method for a piezoelectric element.

2. Related Art

As a material having excellent piezoelectricity and excellent ferroelectricity, there is known a perovskite-type oxide material such as lead zirconate titanate ($Pb(Zr, Ti)O_3$, hereinafter referred to as PZT). The PZT is used in a ferroelectric random access memory (FeRAM) which is a non-volatile memory, by taking advantage of the ferroelectricity thereof. Furthermore, in recent years, a MEMS piezoelectric element including a PZT film has been put into practical use by fusing with micro electro-mechanical systems (MEMS) technology. A PZT film is applied as a piezoelectric film in a piezoelectric element having a lower electrode, a piezoelectric film, and an upper electrode on a substrate. This piezoelectric element has been developed into various devices such as an inkjet head (an actuator), a micromirror device, an angular velocity sensor, a gyro sensor, and an oscillation power generation device.

For applying a piezoelectric element to a device, the piezoelectric element is required to have long-term stability. JP2006-086223A describes that a metal oxide layer is provided between the electrode and a piezoelectric film in order to suppress the deterioration of piezoelectric characteristics caused by an electric field. JP2006-086223A describes that the deterioration of the piezoelectric characteristics is due to the fact that in a case where an electric field is applied to a piezoelectric element in a state where water droplets are attached to the piezoelectric element, the moisture is electrolyzed and penetrates into the piezoelectric film in the form of ions, and a material constituting the piezoelectric layer is reduced to generate oxygen pores. Here, the deterioration of the piezoelectric characteristics is suppressed by compensating for oxygen pores in the piezoelectric film with oxygen in a metal oxide layer provided adjacent to the piezoelectric film.

JP2013-197496A also discloses a configuration in which an oxide conductive layer is provided as an upper electrode layer that is provided adjacent to the piezoelectric film.

SUMMARY

In JP2006-086223A, examples of the oxide conductive layer include indium-tin-oxide (ITO), iridium oxide (IrOx), ruthenium oxide (RuOx), and platinum oxide (PtOx). Ir, Ru, Pt, and the like are very expensive. On the other hand, ITO is inexpensive and suitable for suppressing the manufacturing cost of the piezoelectric element.

According to the examination by the inventors of the present invention, in a piezoelectric element including ITO as an oxide conductive layer on a piezoelectric film, there is no difference in electric resistance and adhesiveness as compared with a case where $IrO_2$ is provided as the oxide conductive layer, and the electric resistance and the adhesiveness are favorable. On the other hand, the inventors of the present invention found that a piezoelectric element including ITO on a piezoelectric film has a small electrostatic capacity of the piezoelectric film as compared with a piezoelectric element including $IrO_2$ on the piezoelectric film. The decrease in the electrostatic capacity means a decrease in the piezoelectric characteristics of the piezoelectric element.

The technology according to the present disclosure has been made in consideration of the above circumstances, and an object of the present disclosure is to provide a piezoelectric element and a manufacturing method for a piezoelectric element, in which a manufacturing cost can be suppressed and a decrease in piezoelectric characteristics is suppressed.

Specific means for solving the above problems include the following aspects.

The piezoelectric element according to the present disclosure is a piezoelectric element comprising, on a substrate in the following order, a lower electrode layer, a piezoelectric film containing a perovskite-type oxide as a main component, and an upper electrode layer, in which at least a region of the upper electrode layer closest to a side of the piezoelectric film is composed of an oxide conductive layer containing In, and regarding an interface region between the piezoelectric film and the oxide conductive layer of the upper electrode layer, in an intensity profile of binding energy, which is acquired by an X-ray photoelectron spectroscopy measurement, in a case where a peak intensity of binding energy derived from a $3d_{5/2}$ orbital of In bonded to oxygen is defined as a, and a peak intensity of binding energy derived from a $3d_{5/2}$ orbital of In bonded to an OH group is defined as γ, a peak intensity ratio γ/α satisfies Expression (1).

$$\gamma/\alpha \le 0.25 \quad (1)$$

In the piezoelectric element according to the present disclosure, it is preferable that in the intensity profile of the binding energy, the peak intensity ratio γ/α satisfies Expression (2).

$$\gamma/\alpha \le 0.1 \quad (2)$$

In the piezoelectric element according to the present disclosure, it is preferable that the perovskite-type oxide contains Pb, Zr, Ti, and O.

In the piezoelectric element according to the present disclosure, it is preferable that the perovskite-type oxide is a compound represented by General Formula (3), $$Pb\{(Zr_xTi_{1-x})_{y-1}B1_y\}O_3 \quad (3)$$

here, 0<x<1, 0<y<0.3, and

B1 is one or more elements selected from V, Nb, Ta, Sb, Mo, and W.

In the piezoelectric element according to the present disclosure, it is preferable that the oxide conductive layer contains at least one of Zn, Sn, or Ga.

A manufacturing method for a piezoelectric element according to one aspect of the present disclosure includes a sputtering step of forming a film of the oxide conductive layer containing In on the piezoelectric film of a laminate including the lower electrode layer and the piezoelectric film on the substrate, where in the sputtering step, a substrate set temperature is set to 350° C. or higher.

A manufacturing method for a piezoelectric element according to another aspect of the present disclosure carries out subjecting a laminate, in which the lower electrode layer, the piezoelectric film, and the oxide conductive layer containing In are laminated on the substrate, to a heating treatment at 350° C. or higher.

According to the piezoelectric element and the manufacturing method of a piezoelectric element according to the present disclosure, it is possible to realize a piezoelectric element in which the manufacturing cost can be suppressed and the deterioration of the piezoelectric characteristics is suppressed.

BRIEF DESCRIPTION OF THE DRAWINGS

FIG. 5A is a graph showing a peak of an In—O bond extracted from a binding energy profile for an interface region of Example 6.

DESCRIPTION OF EMBODIMENTS

Figure 1:
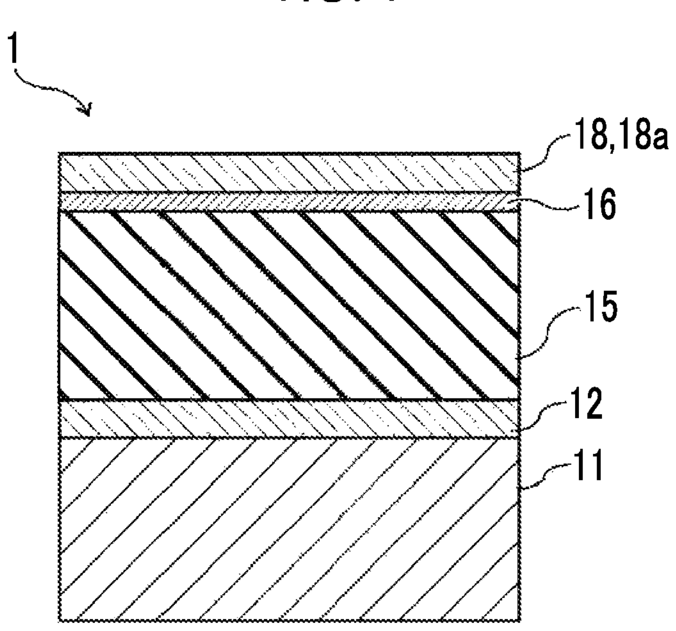
FIG. 1 is a cross-sectional view showing a layer configuration of a piezoelectric element according to one embodiment.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

(Piezoelectric Element)

FIG. 1 is a schematic cross-sectional view showing a layer configuration of a piezoelectric element 1 according to one embodiment. As shown in FIG. 1, a piezoelectric element 1 includes, on a substrate 11, a lower electrode layer 12, a piezoelectric film 15, and an upper electrode layer 18 in this order.

In the upper electrode layer 18, at least a region closest to a side of the piezoelectric film is composed of an oxide conductive layer 18*a* containing In. The phrase "containing In" refers to containing 3 at % or more of In among the metal elements contained in the oxide conductive layer. The content of In is not limited as long as it is 3 at % or more; however, the content of In in the metal elements contained in the oxide conductive layer 18*a* is preferably 5 at % or more and 90 at % or less, and more preferably 30 at % or more.

The oxide conductive layer 18*a* containing In may further contain at least one of Zn, Sn, or Ga, in addition to In. In a case of adding a metal other than In, it is possible to adjust the carrier density of the amorphous oxide layer. The oxide conductive layer 18*a* containing In is preferably ITO, indium-zinc-oxide (IZO), or indium-gallium-zinc-oxide (IGZO), and particularly preferably ITO.

The present embodiment shows an example in which the upper electrode layer 18 has a single layer structure and consists of the oxide conductive layer 18*a* containing In. It is noted that the upper electrode layer 18 may have a laminated structure instead of a single layer structure, and in a case where a laminated structure is provided, it is sufficient that the oxide conductive layer 18*a* is disposed closest to the side of the piezoelectric film. In addition, in a case where the upper electrode layer 18 has a laminated structure, a metal layer may be included.

Regarding an interface region 16 between the piezoelectric film 15 and the upper electrode layer 18, in an intensity profile of binding energy, which is acquired by an X-ray photoelectron spectroscopy measurement, a peak intensity ratio $\gamma/\alpha$ of an intensity $\gamma$ of binding energy derived from a $3d_{5/2}$ orbital of In bonded to an OH group to an intensity $\alpha$ of binding energy derived from a $3d_{5/2}$ orbital of In bonded to oxygen satisfies Expression (1).

$$\gamma/\alpha \leq 0.25 \quad (1)$$

It is noted that although the details of the measuring method for the intensity profile of the binding energy will be described later in Examples, $\alpha$ and $\gamma$ shall be determined as follows. The interface region 16 is subjected to a photoelectron spectroscopy measurement to acquire an intensity profile in which the vertical axis indicates intensity and the lateral axis indicates binding energy. In this case, an intensity profile in a range of at least 440 eV to 450 eV is acquired, and a spectrum derived from the $3d_{5/2}$ orbital of In appearing in the vicinity of 445 eV is acquired. The spectrum derived from the In $3d_{5/2}$ orbital, which is observed in the vicinity of 445 eV includes a peak derived from In bonded to oxygen (that is, derived from an I—O bond) and a peak derived from In bonded to an OH group (that is, that is, derived from an I—OH bond). Here, assuming that the binding energy of the In—O bond is 444.6±0.3 [eV] and the binding energy of the In—OH bond is 445.3±0.3 [eV], the peak derived from the In—O bond and the peak derived from the In—OH bond are separated from each other in the spectrum derived from the $3d_{5/2}$ orbital of In. It is noted that for the binding energy, the database of the National Institute of Standards and Technology (NIST) ([online], [searched on Mar. 23, 2021], and the Internet, <URL: https://srdata.nist.gov/xps/main search menu.aspx>, were referenced. A peak value of the peak derived from the In—O bond was defined as the intensity $\alpha$ of binding energy of the In—O bond, and a peak value of the peak derived from the In—OH bond was defined as the intensity $\gamma$ of binding energy of the In—OH bond.

The inventors of the present invention have found that in a case of adopting the above-described piezoelectric element configuration, it is possible to realize the piezoelectric element 1 that maintains high piezoelectric characteristics without deteriorating the piezoelectric characteristics of the piezoelectric film 15 (see Examples below). As described above, in a case of providing the oxide conductive layer 18*a* in a region of the upper electrode layer 18 closest to the side of the piezoelectric film 15, oxygen elements are less likely to come out from the piezoelectric film 15 as compared with a case where the region closest to the side of the piezoelectric film 15 is a metal, and an effect of improving long-term stability is obtained. On the other hand, in a case of forming a film of the oxide conductive layer 18*a* in the upper electrode layer 18 on the piezoelectric film 15 by a sputtering method, it is easy to form the interface region 16 including an OH group between the piezoelectric film 15 and the upper electrode layer 18. Although the details of the manufacturing method for a piezoelectric element will be described later, each layer of the present piezoelectric element is formed into a film by a sputtering method. The inventors of the present invention have found that in a case of sufficiently reducing the OH group in the interface region 16, it is possible to realize a piezoelectric element having high piezoelectric characteristics. In addition, the oxide conductive layer containing In is a material that is used as a transparent electrode layer in the field of the liquid crystal display and is inexpensive. As a result, it is possible to produce at a low cost the piezoelectric element 1 having favorable piezoelectric characteristics without causing the deterioration of the piezoelectric characteristics.

It is noted that in the above-described intensity profile of the binding energy, the peak intensity ratio $\gamma/\alpha$ more preferably satisfies Expression (2).

$$\gamma/\alpha \leq 0.1 \tag{2}$$

Further, in a case where Expression (2) is satisfied, a piezoelectric element having higher piezoelectric characteristics can be obtained.

It is noted that although the lower limit value of $\gamma/\alpha$ is 0, it is preferable to satisfy $0.03 \leq \gamma/\alpha$. A piezoelectric element satisfying $0.03 \leq \gamma/\alpha$ can be manufactured at a low cost.

It is noted that the details of the measuring method for the intensity profile of the binding energy will be described later in Examples.

The piezoelectric film 15 contains, as a main component, a perovskite-type oxide represented by the general formula $ABO_3$.

In the general formula, A is an A site element, which is one of Pb, barium (Ba), lanthanum (La), Sr, bismuth (Bi), lithium (Li), sodium (Na), calcium (Ca), cadmium (Cd), magnesium (Mg), or potassium (K), or a combination of two or more thereof.

In the general formula, B is a B site element, which is one of Ti, Zr, vanadium (V), Nb (niobium), tantalum (Ta), chromium (Cr), molybdenum (Mo), tungsten (W), manganese (Mn), iron (Fe), Ru, cobalt (Co), Ir, nickel (Ni), copper (Cu), zinc (Zn), gallium (Ga), In, tin, antimony (Sb), or a lanthanide element, or a combination of two or more thereof.

In the general formula, O is oxygen.

Regarding A:B:O, a reference ratio is 1:1:3; however, the ratio may deviate within a range in which a perovskite structure is obtained.

It is noted that the piezoelectric film 15 is preferably occupied by 80% by mole or more of the perovskite-type oxide. Further, it is preferable that the piezoelectric film 15 consists of a perovskite-type oxide (however, it contains unavoidable impurities).

The perovskite-type oxide is preferably a lead zirconate titanate (PZT) type that contains lead (Pb), zirconium (Zr), titanium (Ti), and oxygen (O).

In particular, it is preferable that the perovskite-type oxide is a compound represented by General Formula (3), which contains an additive B in the B site of PZT.

$$Pb\{(Zr_xTi_{1-x})_{1-y}B1y\}O_3 \tag{3}$$

Here, B1 is preferably one or more elements selected from vanadium (V), niobium (Nb), tantalum (Ta), antimony (Sb), molybdenum (Mo), and tungsten (W). Here, $0<x<1$ and $0<y<0.3$ are satisfied. It is noted that regarding $Pb:\{(Zr_xTi_{1-x})_{1-y}B1_y\}:O$ in General Formula (3), a reference ratio thereof is 1:1:3; however, the ratio may deviate within a range in which a perovskite structure is obtained.

B1 may be a single element such as V only or Nb only, or it may be a combination of two or three or more elements, such as a mixture of V and Nb or a mixture of V, Nb, and Ta. In a case where B1 is these elements, a very high piezoelectric constant can be realized in combination with Pb of the A site element.

The thickness of the piezoelectric film 15 is generally 200 nm or more, and it is, for example, 0.2 μm to 5 μm. However, it is preferably 1 μm or more.

The substrate 11 is not particularly limited, and examples thereof include substrates such as silicon, glass, stainless steel, yttrium-stabilized zirconia, alumina, sapphire, and silicon carbide. As the substrate 11, a laminated substrate such as a thermal oxide film-attached silicon substrate having a $SiO_2$ oxide film formed on the surface of the silicon substrate, may be used.

The lower electrode layer 12 is paired with the upper electrode layer 18 and is an electrode for applying a voltage to the piezoelectric film 15. The main component of the lower electrode layer 12 is not particularly limited, and examples thereof include metals such as gold (Au), platinum (Pt), iridium (Ir), ruthenium (Ru), Ti, Mo, Ta, aluminum (Al), copper (Cu), and silver (Ag), and metal oxides thereof, as well as combinations thereof. In addition, indium tin oxide (ITO), $LaNiO_3$, $SrRuO_3$ (SRO), or the like may be used. Various intimate attachment layers or seed layers may be included between the piezoelectric film 15 and the lower electrode layer 12 and between the lower electrode layer 12 and the substrate 11.

Here, "lower" and "upper" do not respectively mean top and bottom in the vertical direction. As a result, an electrode disposed on the side of the substrate with the piezoelectric film being interposed is merely referred to as the lower electrode, and an electrode disposed on the side of the piezoelectric film opposite to the substrate is merely referred to as the upper electrode.

The layer thicknesses of the lower electrode layer 12 and the upper electrode layer 18 are not particularly limited, and they are preferably about 50 nm to 300 nm and more preferably 100 nm to 300 nm.

(Manufacturing Method for Piezoelectric Element)

A first embodiment and a second embodiment of a manufacturing method for the piezoelectric element 1 will be described.

First Embodiment

In the first embodiment of the manufacturing method for the piezoelectric element 1, first, the lower electrode layer 12 and the piezoelectric film 15 are sequentially subjected to film formation on the substrate 11 by a sputtering method. Next, the upper electrode layer 18 is subjected to film formation on the piezoelectric film 15. The film forming step of the upper electrode layer 18 includes a sputtering step of forming a film of the oxide conductive layer **18*a* containing In on the piezoelectric film 15 of a laminate including the lower electrode layer 12 and the piezoelectric film 15 on the substrate 11**.

In the sputtering step of forming the film of the oxide conductive layer **18*a* containing In, the substrate set temperature is set to 350° C. or higher. The substrate set temperature is preferably 400° C. or lower, and more preferably 350° C. or higher and 360° C. or lower. With this film formation, the interface region 16 in which a peak intensity ratio $\gamma/\alpha$ is 0.25 or less is formed between the piezoelectric film 15 and the oxide conductive layer 18*a***, where a peak intensity of binding energy derived from a $3d_{5/2}$ orbital of In bonded to oxygen is denoted as a, and a peak intensity of binding energy derived from a $3d_{5/2}$ orbital of In bonded to an OH group is denoted as γ in an intensity profile of binding energy, which is acquired by an X-ray photoelectron spectroscopy measurement.

It is noted that in the sputtering step of forming the film of the oxide conductive layer 18*a*, it is preferable that the film forming chamber is subjected to vacuuming until the back pressure reaches $1\times10^{-4}$ or less.

Second Embodiment

In the second embodiment of the manufacturing method for the piezoelectric element 1, first, the lower electrode layer 12 and the piezoelectric film 15 are sequentially subjected to film formation on the substrate 11 by a sputtering method. Next, the upper electrode layer 18 is subjected to film formation on the piezoelectric film 15. The film forming step of the upper electrode layer 18 includes a sputtering step of forming a film of the oxide conductive layer 18*a* containing In on the piezoelectric film 15 of a laminate including the lower electrode layer 12 and the piezoelectric film 15 on the substrate 11. Further, a laminate, in which the lower electrode layer 12, the piezoelectric film 15, and the oxide conductive layer 18*a* containing In are laminated on the substrate 11, is subjected to a heating treatment at 350° C. or higher. The temperature of the heating treatment is preferably 400° C. or lower, and more preferably 350° C. or higher and 360° C. or lower. The heating treatment is a vacuum annealing treatment. In this case, a substrate may not be heated in the sputtering film formation of the oxide conductive layer 18*a* containing In, and the substrate set temperature may be room temperature (RT). The heating time is preferably about 0.5 hours (h) to 3 h.

According to the manufacturing methods according to the first embodiment and the second embodiment, the peak intensity ratio γ/α in the interface region 16 between the piezoelectric film 15 and the oxide conductive layer 18*a* containing In can be set to 0.25 or less in the intensity profile of binding energy in the interface region 16, which is acquired by an X-ray photoelectron spectroscopy measurement. As a result, it is possible to obtain the piezoelectric element 1, in which the manufacturing cost is suppressed, without deteriorating the piezoelectric characteristics of the piezoelectric film 15.

As described above, in a case of forming a film of the oxide conductive layer 18*a* in the upper electrode layer 18 on the piezoelectric film 15 by a sputtering method, it is easy to form the interface region 16 including an OH group at an interface between the piezoelectric film 15 and the upper electrode layer 18. In a case of sufficiently reducing the back pressure in the film forming chamber before subjecting the oxide conductive layer 18*a* to sputtering film formation, the residual gas can be reduced, and as a result, the amount of OH groups can be reduced. However, the effect of suppressing the content of the OH group contained in the interface region 16 is not sufficient only by adjusting the back pressure. On the other hand, in the first embodiment, since the oxide conductive layer 18*a* containing In is formed into a film at a substrate set temperature of 350° C. or higher, the OH group can be sufficiently removed. Similarly, in the second embodiment, since the oxide conductive layer 18*a* containing In is subjected to a heating treatment at 350° C. or higher after the film formation, the OH group can be sufficiently removed.

There is a case where a treatment, in which amorphous ITO is formed into a film and then an annealing treatment is carried out to improve the crystallinity, is carried out as a method of forming an ITO layer. However, the temperature of this annealing treatment is generally about 200° C. to 250° C. The OH groups adsorbed to the surface of the film forming surface can be eliminated at approximately 120° C. On the other hand, it is necessary to carry out heating to 350° C. or higher in order to eliminate the OH group bonded to a metal such as In. In the manufacturing method according to the first embodiment and/or the second embodiment, a large amount of OH groups can be eliminated by carrying out heating at 350° C. or higher during or after film formation. Therefore, according to the manufacturing methods according to the first embodiment and the second embodiment, it is possible to obtain the piezoelectric element 1, in which the OH group in the interface region 16 is sufficiently suppressed.

EXAMPLES

Hereinafter, Examples and Comparative Examples according to the present disclosure will be described.

First, a manufacturing method for a piezoelectric element of each of Examples and Comparative Examples will be described. The description of the manufacturing method will be made with reference to the reference numerals of the respective layers of the piezoelectric element 1 shown in FIG. 1.

(Formation of Film of Lower Electrode Layer)

As the substrate 11, a 25 mm square thermal oxide film-attached silicon substrate was used. The lower electrode layer 12 was formed into a film on the substrate 11 by radio-frequency (RF) sputtering. Specifically, as the lower electrode layer 12, a Ti layer having a thickness of 20 nm and an Ir layer having a thickness of 150 nm were laminated on the substrate 11 in this order. The sputtering conditions for each layer were as follows.

—Sputtering Conditions for Ti Layer—
Distance between target and substrate: 100 mm
Target input power: 600 W
Ar gas pressure: 0.2 Pa
Substrate set temperature: 350° C.
—Sputtering Conditions for Ir Layer—
Distance between target and substrate: 100 mm
Target input power: 600 W
Ar gas pressure: 0.2 Pa
Substrate set temperature: 350° C.

(Formation of Piezoelectric Film)

The substrate with the lower electrode layer was placed in an RF sputtering apparatus, and an Nb-doped PZT film of 2 μm was formed, where the Nb-doping amount to the B site was set to 10 at %. The sputtering conditions in this case were as follows.

—Sputtering Conditions for Piezoelectric Film—
Distance between target and substrate: 60 mm
Target input power: 500 W
Vacuum degree: 0.3 Pa, an $Ar/O_2$ mixed atmosphere (02 volume fraction: 2.0%)
Substrate set temperature: 700° C.

The steps up to the film formation of the piezoelectric film are common to all Examples and Comparative Examples. The following method or film forming condition for forming the upper electrode layer is different between Examples and Comparative Examples.

(Formation of Film of Upper Electrode Layer)

Next, as the upper electrode layer 18 having a thickness of 150 nm, an oxide layer containing In was formed on the surface of the piezoelectric film 15 by sputtering. For each of Examples and Comparative Examples, the upper electrode layer 18 consisting of the upper electrode layer material shown in Table 1 was formed. It is noted that an ITO target was used in a case of forming an ITO layer as the oxide layer containing In, an IZO target was used in a case of forming an IZO layer as the oxide layer containing In, and an IGZO target was used in a case of forming an IGZO layer as the oxide layer containing In. As the targets, targets all having a diameter of 4 inches and 4N, manufactured by Toshima Manufacturing Co., Ltd., were used.

A substrate after forming a piezoelectric film was placed in a film forming chamber of a direct current (DC) sputtering apparatus, each of Examples and Comparative Examples was subjected to vacuuming to the back pressure shown in Table 1, and then an $Ar/O_2$ mixed gas was introduced into the apparatus so that the film formation pressure was 0.18 Pa. The substrate set temperature of the $Ar/O_2$ mixed gas as the film forming gas was set to room temperature (RT), and the target input power was set to 200 W. The condition of the $O_2$ flow rate ratio was set in advance so that the oxide conductive layer had the lowest resistance in each target, and then film formation was carried out. For each of Examples and Comparative Examples, the substrate set temperature in the film formation was set as shown in Table 1. In a case where the substrate set temperature was not room temperature (RT), the heating unit was set to the substrate set temperature in advance and heated, and after being stabilized, the substrate was transported and set at the film formation position. The time taken by the substrate being substantially heated from the moment when the substrate was set until the film formation was completed and the substrate was discharged was 1 hour.

(Heating Treatment)

It is noted that for Comparative Examples 1, 3, 5, and 6, Examples 1 to 3, and Examples 5 and 6, a heating treatment (vacuum annealing) was carried out after the formation of the film of the upper electrode layer. The temperature and the time of the heating treatment were set to the temperature and the time described in parentheses, which are described in the column of "Heating treatment temperature after film formation" in Table 1. It is noted that the description of "non" in Table 1 means that the heating treatment was not carried out.

It is noted that after the electrode layer was formed into a film, the heating treatment was carried out as it was without being taken out from the film forming chamber. It is noted that the heating time is the time taken from the moment when the temperature reached a set temperature until the set temperature was maintained.

<Measurement of Piezoelectric Constant $d_{31}$>

The piezoelectric constant $d_{31}$ was measured. The piezoelectric element produced as described above was cut into a strip shape of 2 mm×25 mm to produce a cantilever, and according to the method described in I. Kanno et. al. Sensor and Actuator A 107 (2003) 68, the measurement of the piezoelectric constant $d_{31}$ was carried out with an applied voltage of sine wave of −10 V±10 V. The results are shown in Table 1.

<Measurement of Dielectric Constant>

Figure 2:
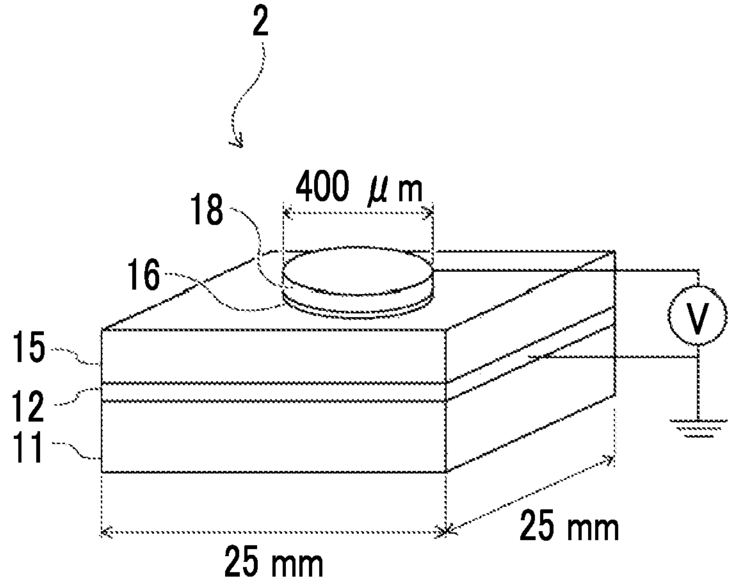
FIG. 2 is a view showing a schematic configuration of an evaluation sample.

For each of Examples and Comparative Examples, the measurement of the dielectric constant was carried out using an evaluation sample 2 shown in FIG. 2. The evaluation sample 2 was produced by using a metal mask having an opening having a diameter of 400 μm at the time of forming the upper electrode layer in the above-described manufacturing method. A sputtering film formation was carried out through a metal mask to obtain the evaluation sample 2 including the circular upper electrode layer 18 having a diameter of 400 μm.

The dielectric constant was measured. For each of Examples and Comparative Examples, the measurement of the dielectric constant was carried out using the evaluation sample 2 and using an impedance analyzer manufactured by Agilent Technologies, Inc. The results are shown in Table 1.

<Evaluation of OH Content in Interface Region>

The OH content in the interface region was evaluated by the photoelectron spectroscopy measurement of the interface region.

Figures 3A, 3B:
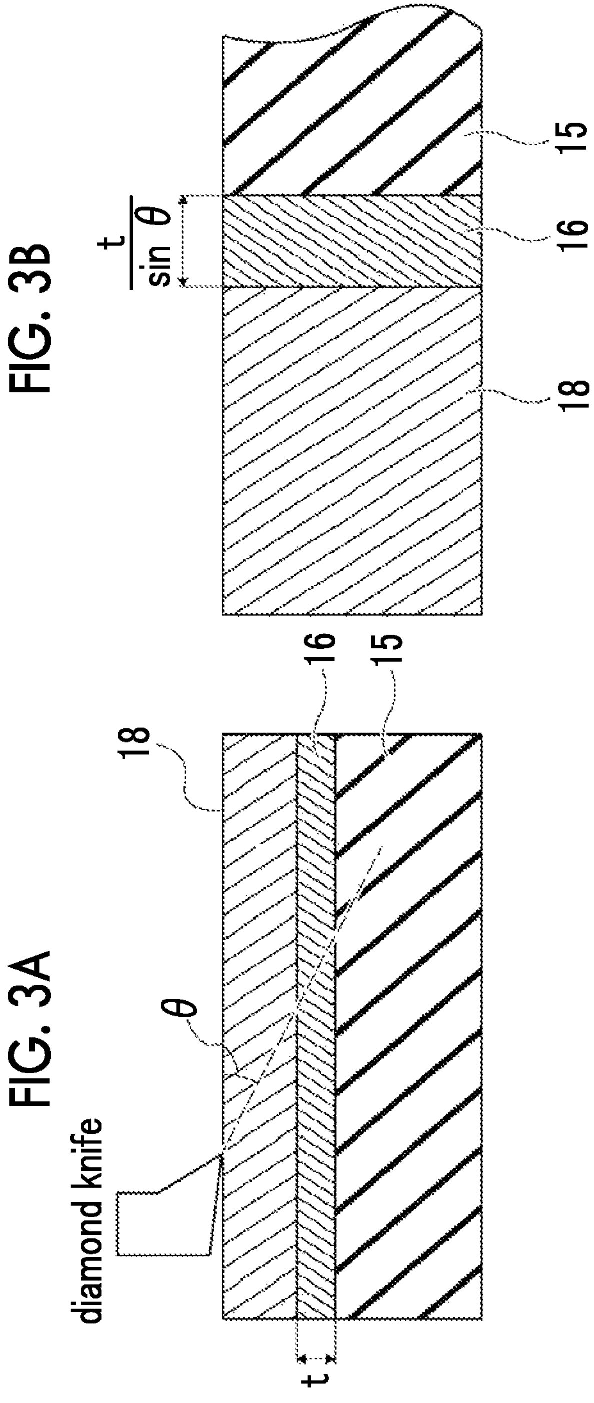
FIGS. 3A and 3B are explanatory views of a production method for a sample for photoelectron spectroscopy.

FIGS. 3A and 3B are explanatory views of a production method for a sample for the photoelectron spectroscopy measurement. FIG. 3A is a schematic cross-sectional view of a part of a piezoelectric element, and FIG. 3B is a schematic view of a cut surface of a measurement sample obtained from the piezoelectric element shown in FIG. 3A.

A measurement sample for composition analysis was produced for the piezoelectric element of each of Examples and Comparative Examples by using an oblique cutting method. As shown in FIG. 3A, a diamond knife was inserted into the surface of the piezoelectric element at an angle θ, and the piezoelectric element was cut obliquely. As a result, such a cut surface as shown in FIG. 3B was obtained. As shown in FIG. 3B, on the cut surface, the interface region 16 having a thickness t shown in FIG. 3A is exposed with a width of 1/sin θ times. It is noted that the thickness t of the interface region 16 was estimated to be about 10 nm, and the angle θ was set such that the width of the interface region 16 exposed to the cut surface after oblique excavation was 5 μm or more.

A measurement area (an area surrounded by a circle in FIG. 3B) was set such that the piezoelectric film 15 was slightly included in the cut surface obtained as described above and subjected to the photoelectron spectroscopy measurement.

From the intensity profile acquired by the photoelectron spectroscopy measurement, the peak of binding energy of the bond between In and O (the In—O bond) and the peak of binding energy of the bond between In and OH (the In—OH bond) were separated, the peak intensities α and γ were determined respectively, and the peak intensity ratio γ/α was calculated. Table 1 shows the peak intensity ratios γ/α determined for each of Examples and Comparative Examples.

Figure 4A:
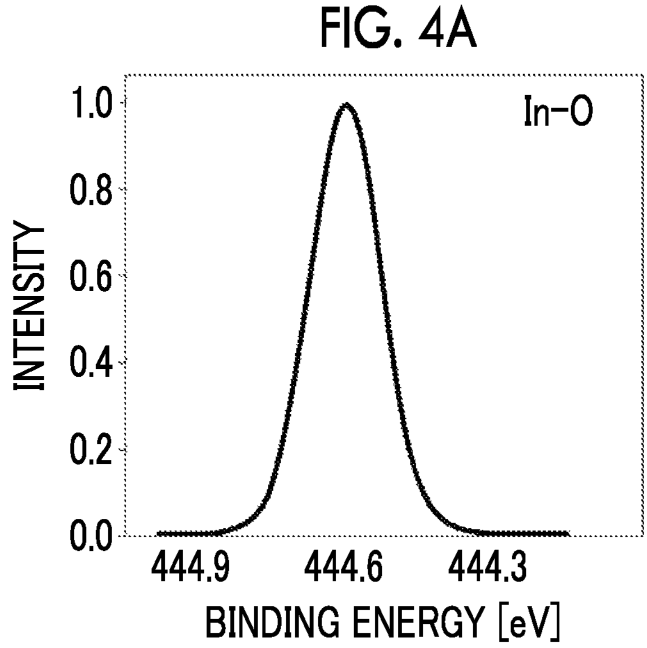
FIG. 4A is a graph showing a peak of an In—O bond extracted from a binding energy profile for an interface region of Comparative Example 3.
Figure 4B:
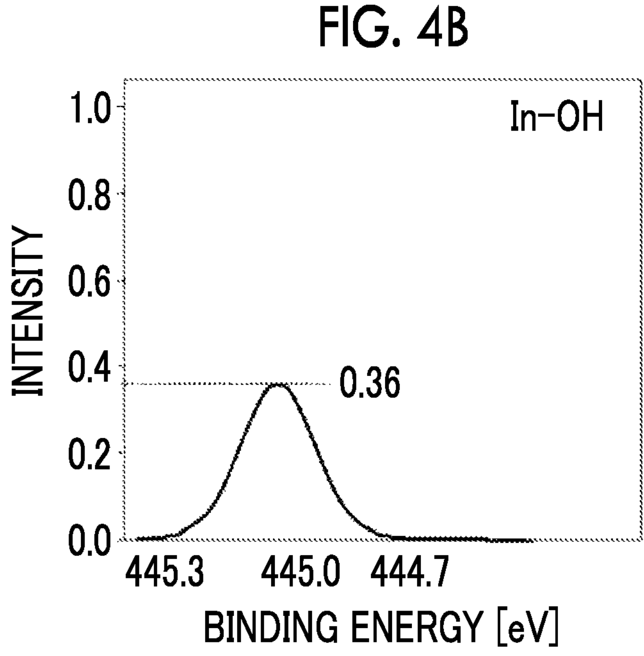
FIG. 4B is a graph showing a peak of an In—OH bond.
Figure 5B:
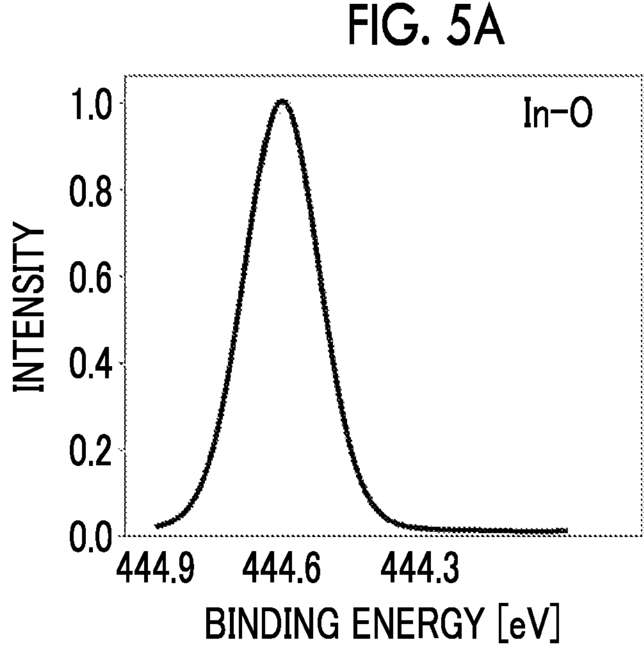
FIG. 5B is a graph showing a peak of an In—OH bond.

FIGS. 4A and 4B show graphs in which, for Comparative Example 3, a peak due to an In—O bond (FIG. 4A) and a peak due to an In—OH bond (FIG. 4B) are separated from the intensity profile of binding energy, acquired by the photoelectron spectroscopy measurement. Similarly, FIGS. 5A and 5B show graphs in which, for Example 6, a peak due to an In—O bond (FIG. 5A) and a peak due to an In—OH bond (FIG. 5B) are separated from the intensity profile of binding energy, acquired by the photoelectron spectroscopy measurement. In each of FIGS. 4A and 4B and FIGS. 5A and 5B, the intensity of the vertical axis is standardized with the peak value of the In—O bond as 1. It is noted that from the measured intensity profile, the In—O bond was subjected to peak separation as 444.6±0.3 [eV] in terms of the binding energy of $In_2O_3$, and the In—OH bond was subjected to peak separation as 445.3±0.3 [eV] in terms of the binding energy of $In(OH)_3$.

TABLE 1

| | Upper electrode material | Back pressure [Pa] | Film formation temperature [° C.] | Heating treatment temperature after film formation [° C.] | Dielectric constant ∈ | Piezoelectric constant $d_{31}$ [pm/V] | γ/α γ: In—OH α: In—O |
|---|---|---|---|---|---|---|---|
| Comparative Example 1 | ITO | $8.80 \times 10^{-6}$ | RT | 300 (2 h) | 1166 | 204 | 0.32 |
| Comparative Example 2 | ITO | $1.80 \times 10^{-4}$ | 300 | non | 1175 | 205 | 0.3 |
| Comparative Example 3 | ITO | $9.20 \times 10^{-6}$ | RT | 250 (2 h) | 1150 | 201 | 0.36 |
| Comparative Example 4 | ITO | $1.40 \times 10^{-4}$ | 250 | non | 1156 | 201 | 0.35 |
| Comparative Example 5 | IZO | $9.00 \times 10^{-6}$ | RT | 300 (2 h) | 1160 | 202 | 0.34 |
| Comparative Example 6 | IGZO | $9.10 \times 10^{-6}$ | RT | 300 (2 h) | 1173 | 205 | 0.3 |
| Example 1 | ITO | $9.00 \times 10^{-6}$ | RT | 350 (0.5 h) | 1202 | 216 | 0.25 |
| Example 2 | ITO | $8.50 \times 10^{-6}$ | RT | 350 (1 h) | 1260 | 225 | 0.1 |
| Example 3 | ITO | $8.70 \times 10^{-6}$ | RT | 350 (2 h) | 1291 | 232 | 0.04 |
| Example 4 | ITO | $2.30 \times 10^{-4}$ | 350 | non | 1253 | 223 | 0.13 |
| Example 5 | IZO | $9.10 \times 10^{-6}$ | RT | 350 (2 h) | 1289 | 231 | 0.04 |
| Example 6 | IGZO | $8.90 \times 10^{-6}$ | RT | 350 (2 h) | 1300 | 232 | 0.03 |
| Example 7 | IZO | $2.40 \times 10^{-4}$ | 350 | non | 1280 | 229 | 0.06 |
| Example 8 | IGZO | $2.25 \times 10^{-4}$ | 350 | non | 1290 | 229.5 | 0.04 |

As shown in Table 1, it is revealed that in Examples 1 to 8 in which $\gamma/\alpha \leq 0.25$ is satisfied at the interface between the piezoelectric film and the oxide conductive layer which is the upper electrode layer, the dielectric constant is high and the piezoelectric constant is high as compared with Comparative Examples 1 to 6 in which $\gamma/\alpha$ exceeds 0.25. In addition, in a case where $\gamma/\alpha \leq 0.1$ is satisfied, the dielectric constant is high and the piezoelectric constant is also high as compared with Examples in which $0.1 < \gamma/\alpha \leq 0.25$ is satisfied. It is still more preferable that $\gamma/\alpha$ is smaller than 0.1.

In a case of carrying out heating to 350° C. or higher during the formation of the film of the upper electrode layer or carrying out a heat treatment at 350° C. or higher after the film formation thereof, a piezoelectric element satisfying $\gamma/\alpha \leq 0.25$ was obtained. On the other hand, even in a case of carrying out the heating treatment, $\gamma/\alpha$ could not be suppressed to 0.25 or less by heating at a temperature lower than 350° C., specifically, 300° C.

The disclosure of JP2021-058186 filed on Mar. 30, 2021 is incorporated in the present specification by reference in its entirety.

All documents, patent applications, and technical standards described in the present specification are incorporated herein by reference, to the same extent as in the case where each of the documents, patent applications, and technical standards is specifically and individually described.

What is claimed is:

1. A piezoelectric element comprising, on a substrate in the following order:
 a lower electrode layer;
 a piezoelectric film containing a perovskite-type oxide as a main component; and
 an upper electrode layer,
 wherein at least a region of the upper electrode layer closest to a side of the piezoelectric film is composed of an oxide conductive layer containing In, and
 regarding an interface region between the piezoelectric film and the oxide conductive layer of the upper electrode layer, in an intensity profile of binding energy, which is acquired by an X-ray photoelectron spectroscopy measurement, in a case where a peak intensity of binding energy derived from a $3d_{5/2}$ orbital of In bonded to oxygen is defined as α, and a peak intensity of binding energy derived from a $3d_{5/2}$ orbital of In bonded to an OH group is defined as γ, a peak intensity ratio γ/α satisfies Expression (1), $$\gamma/\alpha \leq 0.25 \quad (1).$$

2. The piezoelectric element according to claim 1, wherein in the intensity profile of the binding energy, the peak intensity ratio γ/α satisfies Expression (2), $$\gamma/\alpha \leq 0.1 \quad (2).$$

3. The piezoelectric element according to claim 1, wherein the perovskite-type oxide contains Pb, Zr, Ti, and O.

4. The piezoelectric element according to claim 3, wherein the perovskite-type oxide is a compound represented by General Formula (3), $$Pb\{(Zr_xTi_{1-x})_{y-1}B1_y\}O_3 \quad (3)$$

here, $0<x<1$, $0<y<0.3$, and
B1 is one or more elements selected from V, Nb, Ta, Sb, Mo, and W.

5. The piezoelectric element according to claim 1, wherein the oxide conductive layer contains at least one of Zn, Sn, or Ga.

6. A manufacturing method for a piezoelectric element, which is a manufacturing method for the piezoelectric element according to claim 1, the manufacturing method comprising:
 a sputtering step of forming a film of the oxide conductive layer containing In on the piezoelectric film of a laminate including the lower electrode layer and the piezoelectric film on the substrate,
 wherein in the sputtering step, a substrate set temperature is set to 350° C. or higher.

7. A manufacturing method for a piezoelectric element, which is a manufacturing method for the piezoelectric element according to claim 1, the manufacturing method comprising:

subjecting a laminate, in which the lower electrode layer, the piezoelectric film, and the oxide conductive layer containing In are laminated on the substrate, to a heating treatment at 350° C. or higher.

* * * * *